United States Patent
Evans et al.

(10) Patent No.: US 10,276,340 B1
(45) Date of Patent: Apr. 30, 2019

(54) LOW PARTICLE CAPACITIVELY COUPLED COMPONENTS FOR WORKPIECE PROCESSING

(71) Applicant: Varian Semiconductor Equipment Associates, Inc., Gloucester, MA (US)

(72) Inventors: Morgan D. Evans, Manchester, MA (US); Ernest E. Allen, Jr., Rockport, MA (US); Tyler Burton Rockwell, Lynnfield, MA (US); Richard J. Hertel, Boxford, MA (US); Joseph Frederick Sommers, San Jose, CA (US); Christopher R. Campbell, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/848,939

(22) Filed: Dec. 20, 2017

(51) Int. Cl.
*H01J 37/20* (2006.01)
*H01J 37/09* (2006.01)
*H01J 37/317* (2006.01)

(52) U.S. Cl.
CPC .............. *H01J 37/09* (2013.01); *H01J 37/20* (2013.01); *H01J 37/3171* (2013.01); *H01J 2237/202* (2013.01)

(58) Field of Classification Search
CPC ........ H01J 37/09; H01J 37/20; H01J 37/3171; H01J 2237/202
USPC ....... 250/492.1, 492.2, 492.3, 396 R, 440.11
See application file for complete search history.

(56) References Cited

U.S. PATENT DOCUMENTS

| | | | |
|---|---|---|---|
| 8,057,600 B2 | 11/2011 | Nishimoto et al. | |
| 2009/0189083 A1* | 7/2009 | Godyak | H01J 27/18 250/423 R |
| 2012/0261587 A1* | 10/2012 | Kellogg | H01J 27/16 250/396 R |
| 2015/0011093 A1* | 1/2015 | Singh | H01J 37/32422 438/712 |
| 2015/0179409 A1* | 6/2015 | Biloiu | H01J 37/32357 216/66 |
| 2016/0093409 A1 | 3/2016 | Nam et al. | |
| 2016/0217978 A1* | 7/2016 | Mai | H01J 37/32091 |
| 2016/0284520 A1 | 9/2016 | Likhanskii et al. | |

(Continued)

FOREIGN PATENT DOCUMENTS

WO    2015/099988 A1    7/2015

OTHER PUBLICATIONS

International Search Report and Written Opinion dated Mar. 11, 2019 in corresponding PCT application No. PCT/US2018/057315.

*Primary Examiner* — Nicole M Ippolito
(74) *Attorney, Agent, or Firm* — Nields, Lemack & Frame, LLC

(57) ABSTRACT

A system for implanting ions into a workpiece while minimizing the generation of particles is disclosed. The system includes an ion source having an extraction plate with an extraction aperture. The extraction plate is electrically biased and may also be coated with a dielectric material. The workpiece is disposed on a platen and surrounded by an electrically biased shield. The shield may also be coated with a dielectric material. In operation, a pulsed DC voltage is applied to the shield and the platen, and ions are attracted from the ion source during this pulse. Since a pulsed voltage is used, the impedance of the thin dielectric coating is reduced, allowing the system to function properly.

18 Claims, 3 Drawing Sheets

(56) References Cited

U.S. PATENT DOCUMENTS

2016/0293378 A1 10/2016 Mason et al.
2017/0178870 A1 6/2017 Chambers et al.

\* cited by examiner

LOW PARTICLE CAPACITIVELY COUPLED COMPONENTS FOR WORKPIECE PROCESSING

FIELD

Embodiments of the present disclosure relate to systems for wafer processing that include low particle components, and more particularly, systems that include electrically biased components with a dielectric coating.

BACKGROUND

The fabrication of a semiconductor device involves a plurality of discrete and complex processes. One such process may utilize an ion beam, which may be extracted from an ion source. In an ion source, a feed gas is energized to form ions. Those ions are then extracted from the ion source through an extraction aperture disposed on an extraction plate. The ions are attracted to a workpiece that is scanned relative to the extraction aperture. These ions may be used to implant a dopant in the workpiece, etch the workpiece, deposit a coating on the workpiece or amorphize the workpiece.

To attract the ions, the extraction plate and the workpiece may be biased at different voltages. For example, if the workpiece is biased at a voltage that is more negative than the extraction plate, positive ions from within the ion source will be attracted to the workpiece.

In many embodiments, the extraction plate is formed of an electrically conductive material, such as a metal. Similarly, the workpiece is disposed on a second electrically conductive material, commonly referred to as a platen. Another electrically conductive element commonly referred to as a shield or halo, may be configured so that it surrounds the workpiece to protect the neighboring area from the negative effects of ion beam strikes, such as particles and metals being deposited onto the workpiece. The shield or halo also provides a very similar electrical potential surface and current path as the workpiece, in order for the workpiece to be processed uniformly.

One issue associated with this configuration is the generation of particles, especially particles that ultimately become disposed on the workpiece. Specifically, as the ions exit the ion source, the energy of the ions may cause particles to be emitted by the extraction plate. Additionally, the ions striking the shield may also cause particles to be emitted by the shield. These particles may become disposed on the workpiece and may degrade the performance of the workpiece.

Therefore, it would be beneficial if there were a system for implanting ions into a workpiece that reduced the amount of particles that are generated. Further, it would be advantageous if the operating parameters of the system were not negatively affected.

SUMMARY

A system for implanting ions into a workpiece while minimizing the generation of particles is disclosed. The system includes an ion source having an extraction plate with an extraction aperture. The extraction plate is electrically biased and may also be coated with a dielectric material. The workpiece is disposed on a platen and surrounded by an electrically biased shield. The shield may also be coated with a dielectric material. In operation, a pulsed DC voltage is applied to the shield and the platen, and ions are attracted from the ion source during this pulse. Since a pulsed voltage is used, the impedance of the thin dielectric coating is reduced, allowing the system to function properly.

According to a first embodiment, a workpiece processing system is disclosed. The workpiece processing system comprises an ion source, comprising a plurality of chamber walls and an extraction plate with an extraction aperture; and a workpiece holder, disposed proximate to the extraction aperture, the workpiece holder comprising: a platen to hold a workpiece, and a shield surrounding the workpiece; wherein a pulsed DC voltage is applied to the shield to attract ions from the ion source, and wherein the shield and the extraction plate are constructed of conductive materials and at least one of the shield and the extraction plate is coated with a dielectric material. In certain embodiments, both the shield and the extraction plate are coated with the dielectric material. In certain embodiments, the dielectric material comprises a rare earth oxide, which may comprise yttria. In some embodiments, the coefficient of thermal expansion (CTE) of a conductive material that is coated with the dielectric material is within 30% of a CTE of the dielectric material. In certain embodiments, the conductive material comprises tantalum or molybdenum. In certain embodiments, the the DC voltage is pulsed at a frequency between 5 and 50 kHz.

In another embodiment, a workpiece processing system is disclosed. The workpiece processing system comprises an ion source, comprising a plurality of chamber walls; an extraction plate with an extraction aperture; and a blocker disposed within the ion source and proximate the extraction aperture; and a movable workpiece holder, disposed proximate to the extraction aperture, the movable workpiece holder comprising a platen to hold a workpiece, and a shield surrounding the workpiece; wherein ions from an interior of the ion source are attracted toward the platen at an angle defined by the blocker, and wherein the shield and the extraction plate are constructed of conductive materials and at least one of the shield and the extraction plate is coated with a dielectric material. In certain embodiments, a pulsed DC voltage is applied to the shield and the platen, which may be between 5 and 50 kHz.

According to another embodiment, a workpiece processing system is disclosed. The workpiece processing system comprises an ion source, comprising a plurality of chamber walls and an extraction plate with an extraction aperture; and a movable workpiece holder, disposed proximate to the extraction aperture, the movable workpiece holder comprising a platen to hold a workpiece, and a shield surrounding the workpiece; wherein the shield and the extraction plate are constructed of conductive materials and are each coated with a dielectric material, wherein a coefficient of thermal expansion (CTE) of the conductive materials is within 30% of the CTE of the dielectric material. In certain embodiments, the dielectric material comprises yttrium and the conductive material comprises tantalum or molybdenum.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
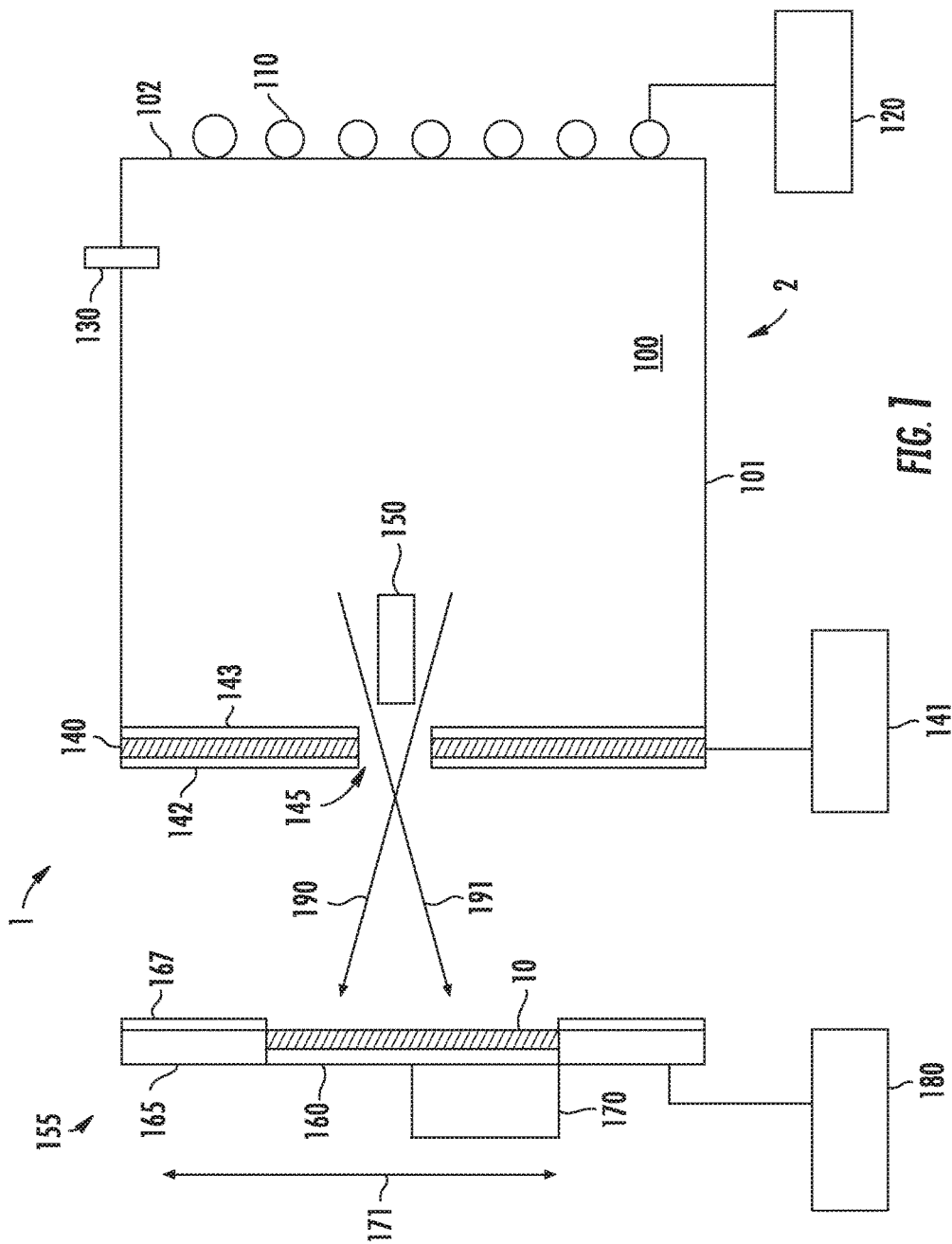
FIG. 1 is a view of the ion source according to one embodiment.

As described above, while ions are being extracted from the ion source, energetic ions may strike various components, causing particles to be emitted by metal components and become disposed on a workpiece. FIG. 1 shows an embodiment of a system that overcomes this issue.

The system 1 includes an ion source 2. The ion source 2 includes an ion source chamber 100, comprised of a plurality of chamber walls 101. In certain embodiments, one or more of these chamber walls 101 may be constructed of a dielectric material, such as quartz. An RF antenna 110 may be disposed on an exterior surface of a first dielectric wall 102. The RF antenna 110 may be powered by a RF power supply 120. The energy delivered to the RF antenna 110 is radiated within the ion source chamber 100 to ionize a feed gas, which is introduced via gas inlet 130.

Figure 2:
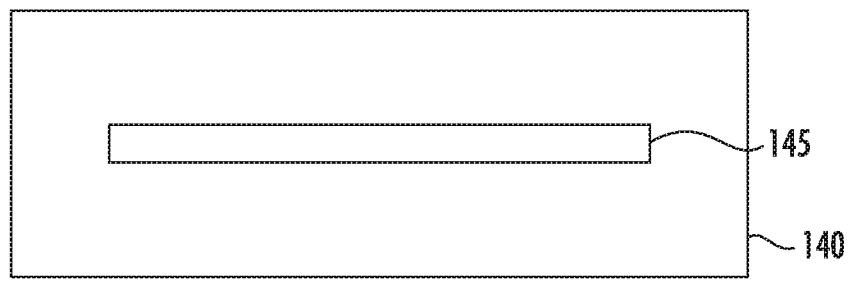
FIG. 2 is a front view of the extraction plate of FIG. 1.

One chamber wall, referred to as the extraction plate 140 includes an extraction aperture 145 through which ions may exit the ion source chamber 100. The extraction plate 140 may be constructed of an electrically conductive material, such as titanium, tantalum or another metal. A front view of the extraction plate 140 is shown in FIG. 2. The extraction plate 140 may be in excess of 300 millimeters in width. Further, the extraction aperture 145 may be wider than the diameter of the workpiece 10. This extraction plate 140 may be biased at an extraction voltage, such as by using an extraction voltage power supply 141. In other embodiments, the extraction plate 140 may be grounded.

Disposed within the ion source chamber 100 may be a blocker 150. The blocker 150 may be a dielectric material that is used to affect the plasma sheath in the vicinity of the extraction aperture 145. For example, in certain embodiments, the blocker 150 is disposed such that the ions exit the extraction aperture 145 at an extraction angle that is not perpendicular to the workpiece 10. In certain embodiments, ions may be extracted at two different extraction angles, such as is shown in FIG. 1. In this embodiment, a first beamlet 190 and a second beamlet 191 are directed toward the workpiece 10. In other embodiments, the ions are extracted at a single extraction angle. The placement of the blocker 150 within the ion source chamber 100 relative to the extraction aperture 145 defines the angle at which the ions impact the workpiece 10.

A movable workpiece holder 155 is disposed proximate the extraction aperture 145. The movable workpiece holder 155 includes a platen 160 on which the workpiece 10 is disposed. The platen 160 is scanned using a scan motor 170, which moves the platen 160 in the direction 171. In other embodiments, the workpiece holder may not be movable. For example, the workpiece holder may be stationary while the ion source chamber 100 is moved. In another embodiment, both the workpiece holder and the ion source chamber 100 may be stationary.

Figure 3:
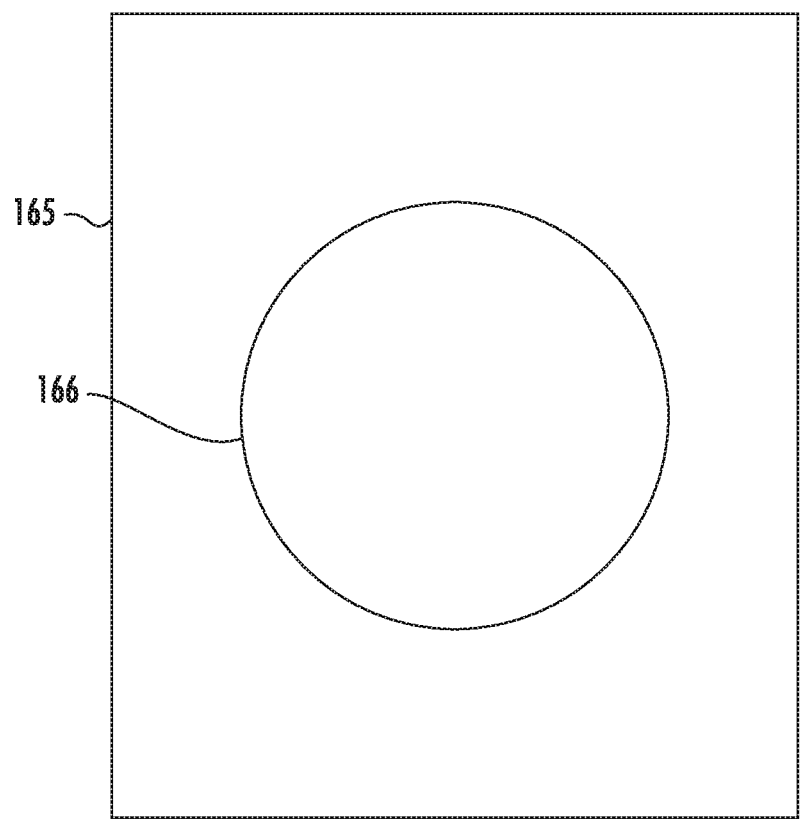
FIG. 3 is a front view of the shield of FIG. 1.

Surrounding the workpiece 10 is a shield 165, which may also be referred to as a halo. A front view of the shield 165 is shown in FIG. 3. The shield 165 surrounds the workpiece 10 and has an opening 166 in its center, which corresponds to the location of the workpiece 10. The shield 165 is constructed of an electrically conductive material, such as a metal.

The shield 165 and platen 160 may be biased using a workpiece bias power supply 180. In certain embodiments, the output from the workpiece bias power supply 180 is a pulsed DC voltage, having a frequency of between 5 kHz and 50 kHz and an amplitude of 100 to 5,000 volts.

While the above disclosure describes the output from the workpiece bias power supply 180 as being a pulsed DC voltage, it is understood that the workpiece bias power supply 180 may be constant, while the extraction voltage power supply 141 provides a pulsed DC output.

When pulsed, the voltage applied to the platen 160 and the shield 165 is more negative than the voltage applied to the extraction plate 140. In other words, if the extraction plate 140 is grounded, the workpiece bias power supply 180 generates negative pulses. During these negative pulses, positive ions are attracted from the interior of the ion source chamber 100 to the workpiece 10. If the extraction plate 140 is positively biased, the workpiece bias power supply 180 generates less positive or negative pulses, such that positive ions are attracted from the interior of the ion source chamber 100 to the workpiece 10 during these pulses.

At least one of the extraction plate 140 and the shield 165 are coated with a dielectric material. Areas that are subject to ion beam strike are preferably coated, but other surfaces may also be coated to prevent chemical reaction. The dielectric material may be a rare earth oxide, such as yttria ($Y_2O_3$). In other embodiments, the dielectric material may be alumina ($Al_2O_3$), zirconia ($ZrO_2$), silicon carbide (SiC), or other materials and combinations of materials, such as combinations of the rare earth oxides and other materials listed above, including, for example, yttria-stabilized zirconia. In all embodiments, the material is etch resistant to both energetic ions or "physical etch", as well as chemical etch such as reactive gas combinations of fluorine and chlorine.

FIG. 1 shows a coating 167 disposed on the front surface of the shield 165. FIG. 1 also shows a coating 142 disposed on an exterior surface of the extraction plate 140, and a coating 143 disposed on an interior surface of the extraction plate 140. The interior surface of the extraction plate 140 is defined as the surface that is within the ion source chamber 100. The thickness of these coatings may be from about 100 nanometers to about 1 millimeter or more. One or more of these coatings may be present in a particular embodiment. For example, in certain embodiments, coatings 142 and 167 are applied. In another embodiment, coating 142, 143 and 167 are applied.

Further, during normal operation, the extraction plate 140 and the shield 165 may be heated by the energetic ions and consequently, may experience thermal expansion. For example, during normal operation, the temperature of the extraction plate 140 and the shield 165 may rise hundreds of degrees Celsius. Furthermore, because the shield 165 moves during normal operation, it is costly and difficult to water or liquid cool the shield 165.

Therefore, it may be preferable that the metal used to construct these components has the same or similar coefficient of thermal expansion (CTE) as the dielectric coating. For example, yttria and alumina both have a coefficient of thermal expansion of about 7 μm/m. Titanium has a CTE of about 9 μm/m, which is within 30% of the CTE of the dielectric coating. In comparison, aluminum has a CTE of over 23 μm/m, which is 300% greater than the CTE of the dielectric coating. Thus, in certain embodiments, the component that is coated with the dielectric material is constructed of titanium or molybdenum. Of course, the component may be constructed from any metal or metal alloy that has a CTE that is within 50% of the CTE of the dielectric coating.

Unexpectedly, when the shield 165 is pulsed with a voltage different than the voltage of the extraction plate 140, arcing does not occur. This is despite the fact that at least one of these components is coated with a dielectric material. In fact, in tests where the difference in voltage between the shield 165 and the extraction plate 140 was 5 kV, no arcing was observed.

Without being limited to a particular theory, it is believed that these coated components are capacitively coupled. Specifically, the pulsed DC voltage that is applied to the shield 165 is the sum of a series of sine waves of increasing frequency. In other words, the pulsed DC voltage is actually an AC voltage with a plurality of different frequencies. It is known that dielectric materials behave as capacitors and therefore, the impedance of these dielectric materials decreases with increasing frequency. Consequently, it is believed that arcing does not occur because the impedance of the dielectric coating is relatively low at higher frequencies. Thus, because of the AC nature of the pulsed DC voltage, the shield 165 and the extraction plate 140 are capacitively coupled.

Further, testing has also shown the extraction angle of ions exiting the extraction aperture 145 is not adversely affected by the dielectric coating.

The system 1 may be a reactive ion etcher (RIE). In other embodiments, the system 1 may be used for deposition, implantation or amorphization.

Figure 4:
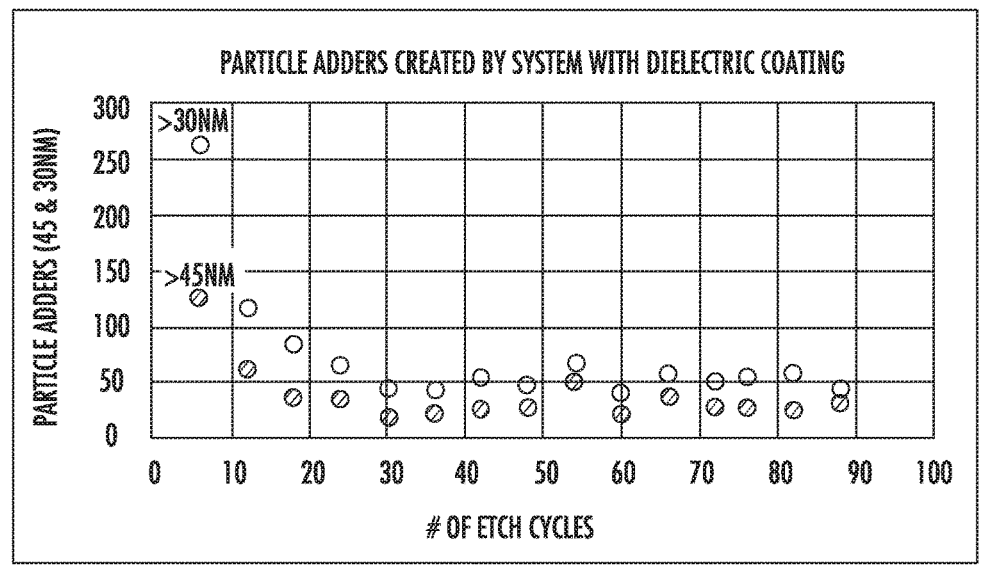
FIG. 4 shows a graph illustrating the reduction in particles over many etches following a manual cleaning process.

The system and method described herein have many advantages. First, the number of particles that are generated during operation is significantly reduced when the extraction plate 140 and the shield 165 are coated with a dielectric material. FIG. 4 shows actual testing that was performed. The solid dots represent particles having a diameter greater than 45 nanometers. The hollow dots represent particles having a diameter of greater than 30 nanometers. It can be seen that the number of particles that are generated decreases with an increasing number of etch cycles. After ninety etch processes, the number of particles that are generated is less than 50. In fact, the average number of particles generated is about 33 after the seventieth etch cycle. In contrast, traditional etching machines generate hundreds or thousands of particles, often of much larger diameter.

Figure 5:
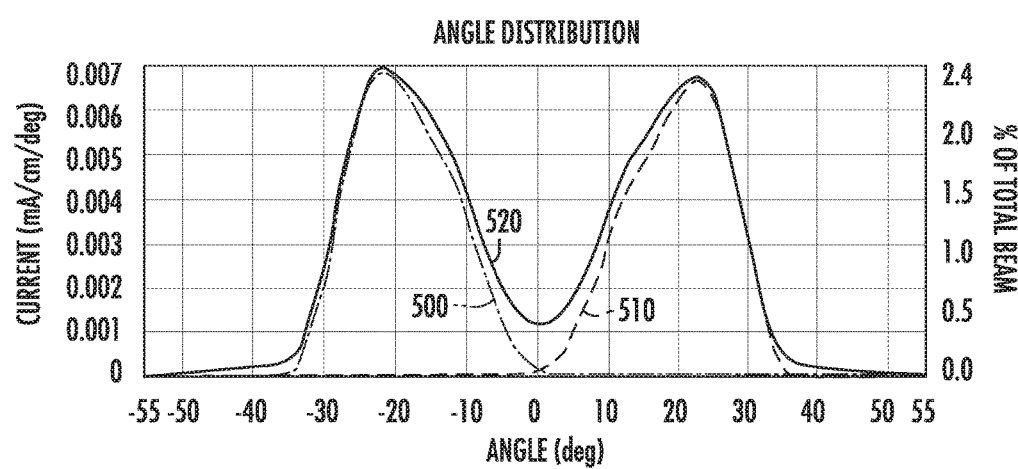
FIG. 5 shows a graph illustrating the current of the ion beams emitted from the ion source as a function of beam angle.

In addition, while the number of particles is significantly reduced by applying a dielectric coating to the shield 165 and/or the extraction plate 140, the performance of the system is not compromised. For example, the extraction angle mean value and spread is relatively unaffected by the incorporation of the dielectric coating. FIG. 5 shows a graph illustrating the relationship between beam current and beam angle for the system of FIG. 1. Line 500 shows the current associated with the first beamlet 190 that is extracted from the extraction aperture 145, while the line 510 shows the current associated with the second beamlet 191. Line 520 shows the sum of these currents. As can be seen, the current of each beamlet peaks at about 22°. Further, the current profile of the two beamlets is nearly identical, though in mirror image. The first beamlet 190 and second 191 beamlet each has a mean beam angle of about 19°, and a beam angle spread of about 13.5°. This is comparable to graphs achieved with traditional systems.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece processing system, comprising:
    an ion source, comprising a plurality of chamber walls and an extraction plate with an extraction aperture; and
    a workpiece holder, disposed proximate to the extraction aperture, the workpiece holder comprising:
        a platen to hold a workpiece, and
        a shield surrounding the workpiece;
    wherein a pulsed DC voltage is applied to the shield to attract ions from the ion source, and
    wherein the shield and the extraction plate are constructed of conductive materials and at least one of the shield and the extraction plate is coated with a dielectric material.

2. The workpiece processing system of claim 1, wherein both the shield and the extraction plate are coated with the dielectric material.

3. The workpiece processing system of claim 1, wherein the dielectric material comprises a rare earth oxide.

4. The workpiece processing system of claim 3, wherein the dielectric material comprises yttria.

5. The workpiece processing system of claim 1, wherein a coefficient of thermal expansion (CTE) of a conductive material that is coated with the dielectric material is within 30% of a CTE of the dielectric material.

6. The workpiece processing system of claim 5, wherein the conductive material that is coated comprises titanium.

7. The workpiece processing system of claim 5, wherein the conductive material that is coated comprises molybdenum.

8. The workpiece processing system of claim 1, wherein the DC voltage is pulsed at a frequency between 5 and 50 kHz.

9. A workpiece processing system, comprising:
    an ion source, comprising:
        a plurality of chamber walls;
        an extraction plate with an extraction aperture; and
        a blocker disposed within the ion source and proximate the extraction aperture; and
    a movable workpiece holder, disposed proximate to the extraction aperture, the movable workpiece holder comprising:
        a platen to hold a workpiece, and
        a shield surrounding the workpiece;
    wherein ions from an interior of the ion source are attracted toward the platen at an angle defined by the blocker, and
    wherein the shield and the extraction plate are constructed of conductive materials and at least one of the shield and the extraction plate is coated with a dielectric material.

10. The workpiece processing system of claim 9, wherein a pulsed DC voltage is applied to the shield and the platen.

11. The workpiece processing system of claim 10, wherein the DC voltage is pulsed at a frequency between 5 and 50 kHz.

12. The workpiece processing system of claim 9, wherein a coefficient of thermal expansion (CTE) of a conductive material that is coated with the dielectric material is within 30% of a CTE of the dielectric material.

13. The workpiece processing system of claim 12, wherein the conductive material that is coated comprises titanium.

14. The workpiece processing system of claim 12, wherein the conductive material that is coated comprises molybdenum.

15. A workpiece processing system, comprising:
an ion source, comprising a plurality of chamber walls and an extraction plate with an extraction aperture; and
a movable workpiece holder, disposed proximate to the extraction aperture, the movable workpiece holder comprising:
a platen to hold a workpiece, and
a shield surrounding the workpiece;
wherein the shield and the extraction plate are constructed of conductive materials and are each coated with a dielectric material, wherein a coefficient of thermal expansion (CTE) of the conductive materials is within 30% of a CTE of the dielectric material.

16. The workpiece processing system of claim 15, wherein a pulsed DC voltage is applied to the shield and the platen.

17. The workpiece processing system of claim 16, wherein the DC voltage is pulsed at a frequency between 5 and 50 kHz.

18. The workpiece processing system of claim 15, wherein the dielectric material comprises yttrium and the conductive materials comprise titanium or molybdenum.

* * * * *